(12) United States Patent
Wraback et al.

(10) Patent No.: US 7,348,201 B2
(45) Date of Patent: Mar. 25, 2008

(54) CREATION OF ANISOTROPIC STRAIN IN SEMICONDUCTOR QUANTUM WELL

(75) Inventors: Michael Wraback, Germantown, MD (US); Mitra Dutta, Wilmette, IL (US); Paul Hongen Shen, North Potomic, MD (US)

(73) Assignee: United States of America as represented by the Secretary of the Army, Washington, DC (US)

( * ) Notice: Subject to any disclaimer, the term of this patent is extended or adjusted under 35 U.S.C. 154(b) by 531 days.

(21) Appl. No.: 11/051,270

(22) Filed: Feb. 3, 2005

(65) Prior Publication Data
US 2006/0169970 A1    Aug. 3, 2006

(51) Int. Cl.
*H01L 21/20* (2006.01)
*H01L 29/15* (2006.01)

(52) U.S. Cl. .................... 438/47; 257/14; 257/18
(58) Field of Classification Search ............ 257/18; 438/47
See application file for complete search history.

(56) References Cited

U.S. PATENT DOCUMENTS

| | | | |
|---|---|---|---|
| 5,381,260 A | 1/1995 | Ballato et al. | 359/248 |
| 5,488,226 A | 1/1996 | Iafrate et al. | 250/338.4 |
| 5,559,613 A | 9/1996 | Deveaud-Pledran et al. | 359/4 |
| 5,579,331 A | 11/1996 | Shen et al. | 372/45 |
| 5,748,359 A | 5/1998 | Shen et al. | 359/248 |
| 5,847,435 A | 12/1998 | Ballato et al. | 257/417 |
| 5,917,194 A | 6/1999 | Dutta et al. | 257/17 |
| 5,953,362 A | 9/1999 | Pamulapati et al. | 372/96 |

OTHER PUBLICATIONS

Sormunen et al., GaN/GaAs(100) superlattices grown by metalorganic vapor phase epitaxy using dimethylhydrazine precursor, Journal of Crystal Growth, 270, 2004, pp. 346-350.*

Shen et al., High Contrast Optical Modulator Based on Electrically Tunable Polarization Rotation and Phase Retardation in Uniaxially Strained (100) Multiple Quantum Wells, IEEE Photonics Technology Letters, vol. 6, No. 6, Jun. 1994, pp. 700-702.*

(Continued)

*Primary Examiner*—David Vu
*Assistant Examiner*—Earl Taylor
(74) *Attorney, Agent, or Firm*—Stephen M. Bloor; Guy M. Miller

(57) ABSTRACT

Methods and devices for creating an anisotropic strain in a semiconductor quantum well structure to induce anisotropy thereof are disclosed herein. Initially, a substrate is provided, and a quantum well structure formed upon the substrate. A first crystalline layer (e.g., a GaAs layer) having a first crystalline phase can then be deposited upon the quantum well structure. Thereafter, a second crystalline layer (e.g., a GaN layer) having a second crystalline phase and a thickness thereof can be formed upon the first crystalline layer to thereby induce an anisotropic strain in the quantum well structure to produce a quantum well device thereof. Additionally, the second crystalline layer (e.g., GaN) can be formed from a transparent material and utilized as an anti-reflection layer. By properly choosing the thickness of the second crystalline layer (e.g., a GaN layer), a desired anisotropic strain as well as a desired anti-reflection wavelength can be achieved.

20 Claims, 2 Drawing Sheets

OTHER PUBLICATIONS

Biermann et al., Double polarization anisotropy in asymmetric, coupled quantum wells under anisotropic, in-plane strain, Optics Express, vol. 10, No. 20, Oct. 2002.*

Huang et al., Absorption Anisotropy for Lattice Matched GaAs/AlGaAs Multiple Quantum Well Structures under External Anisotropic Biaxial Strain: Compression along [110] and Tension along [110], Japan Journal of Applied Physics, vol. 39, 2000, pp. 1776-1781.*

Shi et al., Tunable Photodetectors Based on Strain Compensated GaInAsSb/AlGaAsSb Multiple Quantum Wells Grown by Molecular Beam Epitaxy, IEEE Transactions on Electron Devices, vol. 44, No. 12, Dec. 1997.*

Suzuki et al., Strain effect on electronic and optical properties of GaN/AlGaN quantum-well lasers, Journal of Applied Physics, vol. 80, No. 12, Dec. 1996.*

Ohtoshi et al., Orientation Dependence of Optical Gain in Zincblende-GaN Strained-Quantum-Well Lasers, IEEE Journal of Selected Topics in Quantum Electronics, vol. 4, No. 3, May/Jun. 1998.*

Mukaihara et al., Engineered Polarization Control of GaAs/AlGaAs Surface-Emitting Lasers by Anisotropic Stress from Elliptical Etched Substrate Hole, IEEE Photonics Technology Letters, vol. 5, No. 2, Feb. 1993.*

H. Shen, et al., Properties of Epitaxial ZnO Thin Films for GaN and Related Applications, MRS Internet J. Nitride Semicond. Res. 4S1, G3.60 (1999).

* cited by examiner

CREATION OF ANISOTROPIC STRAIN IN SEMICONDUCTOR QUANTUM WELL

STATEMENT OF GOVERNMENT INTEREST

The invention described herein may be manufactured and used by or for the United States Government for Governmental purposes without the payment of any royalties.

TECHNICAL FIELD

The present invention generally relates to semiconductor devices. The present invention is also related to semiconductor electro-optic devices. The present invention is additionally related to high contrast light modulators used in real time object and pattern recognition, and to infrared, detection and imaging techniques and devices thereof.

BACKGROUND OF THE INVENTION

A variety of electro-optic devices are utilized in scientific, commercial, industrial and consumer applications. Semiconductor multiple quantum well (MQW) modulators represent a type of electro-optic device possessing a broad range of application capabilities. Semiconductor MQW modulators generally operate with incident light normal to the plane of the device. Such devices are well known in the art are of considerable interest because they are the fundamental elements for spatial light modulators, and have the potential for functioning as high speed dynamic range devices that can be integrated with detector and control electronic circuits.

Prior research on normal incidence multiple quantum well light modulators has concentrated on amplitude modulation, relying on a sufficient difference in the absorption coefficient between the on/off states at the operating wavelength to achieve useful contrasts. Such changes in the absorption coefficient have typically been effected by the so-called quantum confined Stark effect (QCSE), Wannier Stark localization, or photo induced excitonic absorption saturation. Note that in general, the Stark effect involves the splitting of atomic spectral lines as a result of an externally applied electric field. The Stark effect has been of marginal benefit in the analysis of atomic spectra, but has been a major tool for molecular rotational spectra.

An example of a spatial light modulator which utilizes a uniaxially strained multiple quantum well device is disclosed in U.S. Pat. No. 5,381,260 entitled, "Uniaxially Strained Semiconductor Multiple Quantum Well Device Using Direction-Dependent Thermal Expansion Coefficients in a Host Substrate," which issued to Ballato et al on Jan. 10, 1995. U.S. Pat. No. 5,381,260 is incorporated herein by reference. U.S. Pat. No. 5,381,260 discloses a spatial light modulator, which utilizes a uniaxially strained multiple quantum well (MQW) structure with an anisotropic absorption to rotate the polarization of light normal to the MQW structure. The anisotropy, which produces this rotation, is the result of a thermally induced in-plane anisotropic strain. The MQW light modulator based on this process possesses a high contrast ration of 7000:1 and increased speed as compared to other similar modulators.

One of the problems associated with spatial light modulators, such as that disclosed in U.S. Pat. No. 5,381,260, is that it is difficult to achieve proper anisotropic strain without the removal of the semiconductor substrate upon which the spatial light modulator is formed, or without using another substrate. Additionally, bonding and lift-off procedures offer additional and often expensive complications to the manufacturing process. The present inventors have thus concluded, based on the foregoing, that a need exists for an improved method and apparatus for inducing anisotropic strain in quantum well structures and devices thereof. If an efficient technique for inducing anisotropic strain can be implemented, it is believed that a wide variety of improvements can be achieved, including, but limited to, high contrast light modulators for real time object and pattern recognition and infrared detection and imaging. The present inventors thus believe that the invention disclosed herein addresses these long-felt needs.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide an improved semiconductor electro-optic device.

It is yet another aspect of the present invention to provide a method for creating an anisotropic strain in a semiconductor quantum well utilizing two or more crystalline layers.

It is still another aspect of the present invention to form a first crystalline layer (e.g., GaAs) upon which a second crystalline layer (e.g., GaN) can be formed.

It is a further aspect of the present invention to provide an improved high-contrast spatial light modulator.

The above and other aspects can be achieved as is now described. Methods and devices for creating an anisotropic strain in a semiconductor quantum well structure to induce anisotropy thereof are disclosed herein. Initially, a substrate is provided, and a quantum well structure formed upon the substrate. A first crystalline layer (e.g., a GaAs layer) having a first crystalline phase can then be deposited upon the quantum well structure. Thereafter, a second crystalline layer (e.g., a GaN layer) having a second crystalline phase and a thickness thereof can be formed upon the first crystalline layer to thereby induce an anisotropic strain in the quantum well structure and produce a quantum well device thereof.

The second crystalline layer (e.g., GaN) can be grown at a temperature of approximately 1000° C. Thus, at room temperature, a thermally induced anisotropic strain can be achieved. Additionally, GaN is chosen for use in forming the second crystalline layer, it can be utilized as an anti-reflection layer, because GaN is transparent. By properly choosing the thickness of the second crystalline layer, a desired anisotropic strain as well as a desired anti-reflection wavelength can be achieved.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
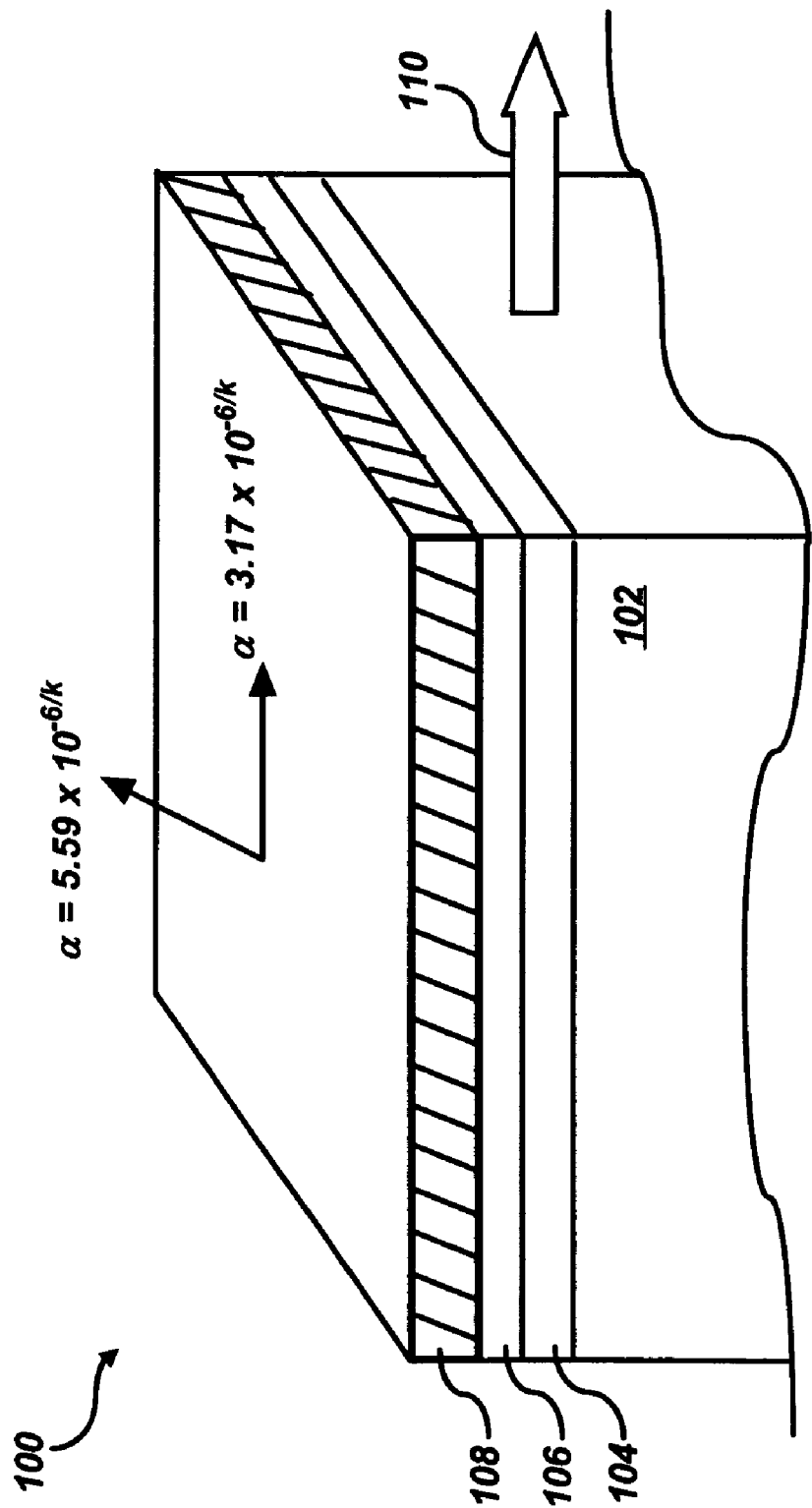
FIG. 1 illustrates a perspective view of a quantum well structure, which can be implemented in accordance with a preferred embodiment of the present invention.

FIG. 1 illustrates a perspective view 100 of a quantum well structure, which can be implemented in accordance with a preferred embodiment of the present invention. FIG. 1 depicts a substrate 102 upon which an MQW layer 104 (i.e., a quantum well layer) can be formed. A first crystalline layer, such as, for example, a GaAs layer 106, can be deposited upon the MQW layer 104. Thereafter, a second crystalline layer, such as, for example, a GaN layer 108, can be formed upon the GaAs layer 106. Note that in general, the second crystalline layer possesses a crystalline phase, which is different than the crystalline phase of the layer upon which it is deposited.

It can be appreciated by those skilled in the art that although GaAs and GaN are described herein as first and second crystalline layers, that other types of materials and crystalline structures may also be implemented in accordance with the present invention. A portion of substrate 102 can be removed to enhance the anisotropic strain to a desired value after deposition of GaAs layer 106. An equilibrium crystal structure can be utilized to form substrate 102. An example of such an equilibrium crystal structure is wurtzie, which possesses thermal expansion properties along different crystalline directions.

One of the thermal expansion coefficients is $5.59 \times 10^{-6/K}$, which is similar to that of GaAs. The other thermal expansion coefficient is generally $3.17 \times 10^{-6/K}$, which is significantly different from that of GaAs. Note that such thermal expansion coefficients are illustrated in FIG. 1. GaN layer 108 is grown upon GaAs layer 106 at approximately 1000° C. Therefore, at room temperature, a thermally induced anisotropic strain can be achieved. Because GaN is transparent at NIR-visible, it can be used as an anti-reflection layer. Thus, GaN layer 108 generally is configured as anti-reflection layer. By proper choosing of the thickness of GaN layer 108, a desired strain as well as a desired anti-reflection wavelength can be achieved. Note that tensile strength is indicated by the direction of arrow 110 in FIG. 1.

Substrate 102 can be formed from a number of substrate materials. One type of substrate material that can be utilized to form substrate 102 is ZnO. In general, high quality zinc oxide (ZnO) films are useful for many applications. One of the more recent applications is the utilization of ZnO as a substrate for the growth of GaN based materials, because the lattice mismatch between GaN and ZnO is relatively small. The most common techniques utilized for depositing ZnO films are laser ablation and sputtering. Improvements have been made through triode sputtering and other recent deposition techniques. Metal-organic chemical vapor deposition (MOCVD), which is well known in the semiconductor fabrication arts, can also be utilized as a growth technique for forming substrate 102 from ZnO.

Shen et al disclose an example of ZnO utilized as a substrate in "Properties of Epitaxial ZnO Thin Films for GaN and Related Applications," which is incorporated herein by reference. Shen et al describes a detailed study of high quality ZnO films, which are epitaxially grown on R-Plane sapphire substrates by MOCVD. Those skilled in the art can appreciate, of course, that a variety of other types of substrate material can be utilized in association with the methods and devices described herein and that the use of ZnO to form a substrate, such as substrate 102, is not considered a limiting feature of the present invention.

Figure 2:
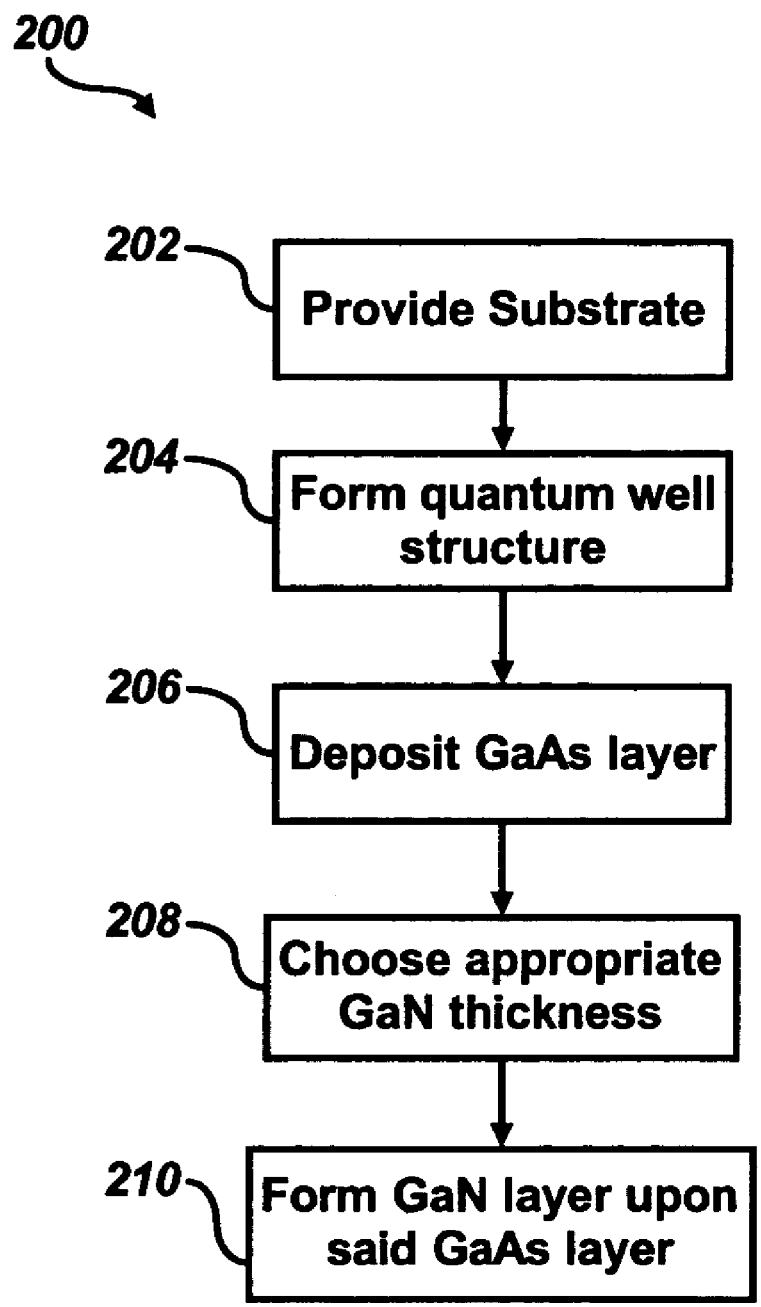
FIG. 2 depicts a high-level flow chart of operations depicting logical operational steps that may be implemented to create an anisotropic strain in a semiconductor quantum well, in accordance with a preferred embodiment of the present invention.

FIG. 2 depicts a high-level flow chart 200 of operations depicting logical operational steps that may be implemented to create an anisotropic strain in a semiconductor quantum well, in accordance with a preferred embodiment of the present invention. As indicated at block 202, a substrate is provided. Thereafter, as illustrated at block 204, a quantum well structure, such as, for example, an MQW, can be formed upon the substrate. Next, as indicated at block 206, a GaAs layer can also be formed upon the substrate. Thereafter, as illustrated at block 208, an appropriate thickness of a GaN layer can be chosen. By choosing the proper thickness of the GaN layer, a desired anisotropic strain as well as a desired anti-reflection wavelength can be achieved. Then, as described at bock 210, a GaN layer can be grown upon the GaAs layer.

Devices implemented in accordance with the present invention can be operated at either a transmission or reflection configuration. In the latter case, a bottom mirror can be utilized. The application of an electric field to the structures described herein can result in tunable polarization and phase retardation, characteristics which make such materials suitable for novel device applications. When an electric field is applied parallel to the growth direction, the quantum-confined Stark effect can produce a shift in the absorption spectrum, which can result in high contrast modulation of the light transmitted through the structure, while an electric field applied in the planer of the layers thereof can provide an anisotropic quenching of the excitonic absorption, a property which may be exploited in the direct optical imaging of terahertz and far-infrared electromagnetic signals.

One of the advantages of the present invention is that anisotropic strain can thus be achieved without the removal of the semiconductor substrate and without utilizing another host substrate, thereby eliminating bonding and lift-off, which is common with prior art procedures. Another advantage of the present invention concerns the utilization of GaN as a stressor as well as anti-reflection layer. Additionally, the present invention utilizes the difference between the growth temperature and the operating temperature to achieve a thermally induced strain.

Based on the foregoing, it can be appreciated that the present invention describes methods and devices for creating an anisotropic strain in a semiconductor quantum well structure to induce anisotropy thereof are disclosed herein. Initially, a substrate is provided provided, and a quantum well structure formed upon the substrate. A GaAs layer can then be deposited upon the quantum well structure. Thereafter, a GaN layer having a thickness thereof can be formed upon the GaAs layer to thereby induce an anisotropic strain in the quantum well structure and produce a quantum well device thereof. GaN can be grown at a temperature of approximately 1000° C. Thus, at room temperature, a thermally induced anisotropic strain can be achieved. Additionally, because GaN is transparent, it can be utilized as an anti-reflection layer. By properly choosing the thickness of the GaN layer, a desired anisotropic strain as well as a desired anti-reflection wavelength can be achieved.

The embodiments and examples set forth herein are presented to best explain the present invention and its practical application and to thereby enable those skilled in the the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the scope of the following claims. It is contemplated that the use of the present invention can involve components having different characteristics. It is also intended that the scope of the present invention be defined by the claims appended hereto, giving full cognizance to equivalents in all respects.

The invention claimed is:

1. A method for creating an anisotropic strain in a semiconductor quantum well structure to induce anisotropy thereof, said method comprising the steps of:
    providing a substrate;
    forming a quantum well structure upon said substrate;
    thereafter depositing a first crystalline layer upon said quantum well structure, wherein said first crystalline layer possesses a first crystalline phase; and
    thereafter forming a second crystalline layer having a thickness thereof and a second crystalline phase upon said first crystalline layer, wherein said second crystalline phase is different than said first crystalline phase of said first crystalline layer, thereby inducing an anisotropic strain in said quantum well structure to produce a quantum well device thereof.

2. The method of claim 1, all the limitations of which are hereby incorporated by reference, wherein said thickness of said second crystalline layer comprises a thickness necessary to induce anisotropy in said quantum well structure.

3. The method of claim 1, all the limitations of which are hereby incorporated by reference, wherein said quantum well device is operable at a transmission configuration.

4. The method of claim 1, all the limitations of which are hereby incorporated by reference, wherein said quantum well device is operable at a reflection configuration.

5. The method of claim 4, all the limitations of which are hereby incorporated by reference, further comprising the step of:
    associating said quantum well device with a bottom mirror in order to operate said quantum well device at said reflection configuration.

6. The method of claim 1, all the limitations of which are hereby incorporated by reference, further comprising the step of:
    applying an electric field to said quantum well device in order to induce tunable polarization and phase retardation thereof.

7. The method of claim 1, all the limitations of which are hereby incorporated by reference, further comprising the step of:
    partially removing a portion of said substrate in order to enhance said anisotropic strain.

8. The method of claim 1, all the limitations of which are hereby incorporated by reference, further comprising the step of:
    partially removing a portion of said substrate in order to adjust said anisotropic strain to a desired value following depositing said first crystalline layer upon said quantum well structure.

9. The method of claim 1, all the limitations of which are hereby incorporated by reference, wherein said second crystalline layer comprises an anti-reflection layer.

10. A method for creating an anisotropic strain in a semiconductor quantum well structure to induce anisotropy thereof, said method comprising the steps of:
    providing a substrate;
    forming a quantum well structure upon said substrate;
    depositing a GaAs layer having a first crystalline phase upon said quantum well structure;
    thereafter forming a GaN layer having a second crystalline phase and a thickness thereof upon said GaAs layer thereby inducing an anisotropic strain in said quantum well structure to produce a quantum well device thereof, wherein said thickness of said GaN layer comprises a thickness necessary to induce anisotrophy in said quantum well structure and wherein said GaN layer comprises an anti-reflection layer; and
    applying an electric field to said quantum well device in order to induce tunable polarization rotation and phase retardation thereof.

11. A semiconductor electro-optic apparatus comprising a quantum well structure having an anisotropic strain thereof, said apparatus comprising:
    a substrate;
    a quantum well structure formed upon said substrate;
    a first crystalline layer having a first crystalline phase thereof, wherein said first crystalline layer is deposited upon said quantum well structure; and
    a second crystalline layer having a second crystalline phase and a thickness thereof, wherein said first crystalline phase is different from said second crystalline phase and wherein said GaN layer is formed upon said GaAs layer to thereby inducing an anisotropic strain in said quantum well structure and produce a quantum well device thereof.

12. The apparatus of claim 11, all the limitations of which are hereby incorporated by reference, wherein said thickness of said second crystalline layer comprises a thickness necessary to induce anisotropy in said quantum well structure.

13. The apparatus of claim 11, all the limitations of which are hereby incorporated by reference, wherein said quantum well device is operable at a transmission configuration.

14. The apparatus of claim 11, all the limitations of which are hereby incorporated by reference, wherein said quantum well device is operable at a reflection configuration.

15. The apparatus of claim 14, all the limitations of which are hereby incorporated by reference, wherein said quantum well device is associated with a bottom mirror in order to operate said quantum well device at said reflection configuration.

16. The apparatus of claim 11, all the limitations of which are hereby incorporated by reference, further comprising:
    electric field mechanism for applying an electric field to said quantum well device in order to induce tunable polarization rotation and phase retardation thereof.

17. The apparatus of claim 11, all the limitations of which are hereby incorporated by reference, wherein a portion of said substrate is partially removed in order to adjust said anisotropic strain.

18. The apparatus of claim 11, all the limitations of which are hereby incorporated by reference, wherein a portion of said substrate is partially removed in order to adjust said anisotropic strain to a desired value following depositing said first crystalline layer upon said quantum well structure.

19. The apparatus of claim 11, all the limitations of which are hereby incorporated by reference, wherein said second crystalline layer comprises an anti-reflection layer.

20. The apparatus of claim 11, all the limitations of which are hereby incorporated by reference, wherein:

said first crystalline layer comprises GaAs:
said second crystalline layer comprises GaN; and
said substrate comprises ZnO.

* * * * *